US010263167B2

(12) United States Patent
Nagae

(10) Patent No.: US 10,263,167 B2
(45) Date of Patent: Apr. 16, 2019

(54) METHOD OF MANUFACTURING SEMICONDUCTOR DEVICE

(71) Applicant: NICHIA CORPORATION, Anan-shi, Tokushima (JP)

(72) Inventor: Yoshiharu Nagae, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/632,513

(22) Filed: Jun. 26, 2017

(65) Prior Publication Data

US 2017/0373234 A1 Dec. 28, 2017

(30) Foreign Application Priority Data

Jun. 27, 2016 (JP) .................. 2016-126244

(51) Int. Cl.
H01L 21/00 (2006.01)
H01L 33/62 (2010.01)
H01L 23/00 (2006.01)
H01L 33/48 (2010.01)
H01L 21/687 (2006.01)
H01L 33/00 (2010.01)

(52) U.S. Cl.
CPC .......... H01L 33/62 (2013.01); H01L 21/6875 (2013.01); H01L 21/68785 (2013.01); H01L 24/97 (2013.01); H01L 33/486 (2013.01); H01L 33/00 (2013.01); H01L 2933/0066 (2013.01)

(58) Field of Classification Search
CPC ....... H01L 33/62; H01L 24/97; H01L 33/486; H01L 21/6875; H01L 21/68785; H01L 33/00
See application file for complete search history.

(56) References Cited

U.S. PATENT DOCUMENTS

| 2003/0164934 | A1 | 9/2003 | Nishi et al. |
| 2007/0160507 | A1 | 7/2007 | Stoh et al. |
| 2012/0000612 | A1 | 1/2012 | Odagiri et al. |
| 2012/0309175 | A1 | 12/2012 | Masumura |

(Continued)

FOREIGN PATENT DOCUMENTS

| JP | S60-39248 U | 3/1985 |
| JP | 10-270535 A | 10/1998 |
| JP | 2000-237983 A | 9/2000 |

(Continued)

Primary Examiner — Richard A Booth
(74) Attorney, Agent, or Firm — Global IP Counselors, LLP

(57) ABSTRACT

A method of manufacturing at least one semiconductor device includes: providing a substrate having a flat lower surface, and an upper surface that allows mounting of at least one semiconductor element or an upper surface having at least one semiconductor mounted thereon; providing a work table having a support plate with a flat support surface for placing the substrate, and having a plurality of support pins arranged at a support surface side and configured to move along an up-and-down direction; abutting the lower surface of the substrate upon tip portions of the plurality of support pins to press down so that the lower surface of the substrate abuts upon the support surface of the support plate; and fixing the substrate on the support plate and performing one or more operations on the substrate.

4 Claims, 4 Drawing Sheets

(56) References Cited

U.S. PATENT DOCUMENTS

2013/0247822 A1* 9/2013 Cho ................ H01J 37/32733
                                                          118/500

FOREIGN PATENT DOCUMENTS

| JP | 2001-028375 A | 1/2001 |
| JP | 2007-189222 A | 7/2007 |
| JP | 2012-015285 A | 1/2012 |
| JP | 4906375 B2 | 3/2012 |
| WO | 2011-105010 A1 | 9/2011 |
| WO | 2015-015955 A1 | 2/2015 |

* cited by examiner

METHOD OF MANUFACTURING SEMICONDUCTOR DEVICE

CROSS-REFERENCE TO RELATED PATENT APPLICATION

This application claims priority to Japanese Patent Application No. 2016-126244, filed Jun. 27, 2016. The entire disclosure of Japanese Patent Application No. 2016-126244 is hereby incorporated herein by reference.

BACKGROUND

1. Technical Field

The present disclosure relates to a method of manufacturing at least one semiconductor device.

2. Description of Related Art

Semiconductor devices can be obtained through manufacturing steps such as placing a plurality of semiconductor elements are mounted on a single substrate, electrically connecting the semiconductor elements and wirings of the substrate by wires or the like, then dividing the substrate into individual semiconductor devices (for example, see Japanese Unexamined Patent Application Publication No. 2001-28375). Before each step, aligning of the substrate is needed, which requires highly accurate aligning using a camera, a sensor, or the like.

Aligning may be performed such that a substrate held by an arm is transferred over a work table, the hold of the arm is released slightly above the work table to drop the substrate on the work table. Thus, the substrate is placed on the work table and the positioning is detected and the substrate or a working jig may be adjusted to precise position. Dropping the substrate can reduce excessive stress applied to the substrate.

SUMMARY

With certain size, shape, and weight, the substrate may be more easily subjected to air resistance while falling. Thus, when the substrate is dropped from the arm, the substrate may slip immediately before coming in contact with the work table. This may result in misplacement of the substrate to a position significantly out of the region that can allow positional adjustment on the work table.

Certain embodiments of the disclosure include configuration as described below.

A method of manufacturing at least one semiconductor device includes: providing a substrate having a flat lower surface, and an upper surface that allows mounting of at least one semiconductor element or an upper surface having at least one semiconductor mounted thereon; providing a work table having a support plate with a flat support surface for placing the substrate, and having a plurality of support pins arranged at a support surface side and configured to move along an up-and-down direction; abutting the lower surface of the substrate upon tip portions of the plurality of support pins to press down so that the lower surface of the substrate abuts upon the support surface of the support plate; and fixing the substrate on the support plate and performing one or more operations on the substrate.

Accordingly, occurrence of misalignment at the time of placing the substrate on the work table can be reduced.

DETAILED DESCRIPTION

Figure 1A:
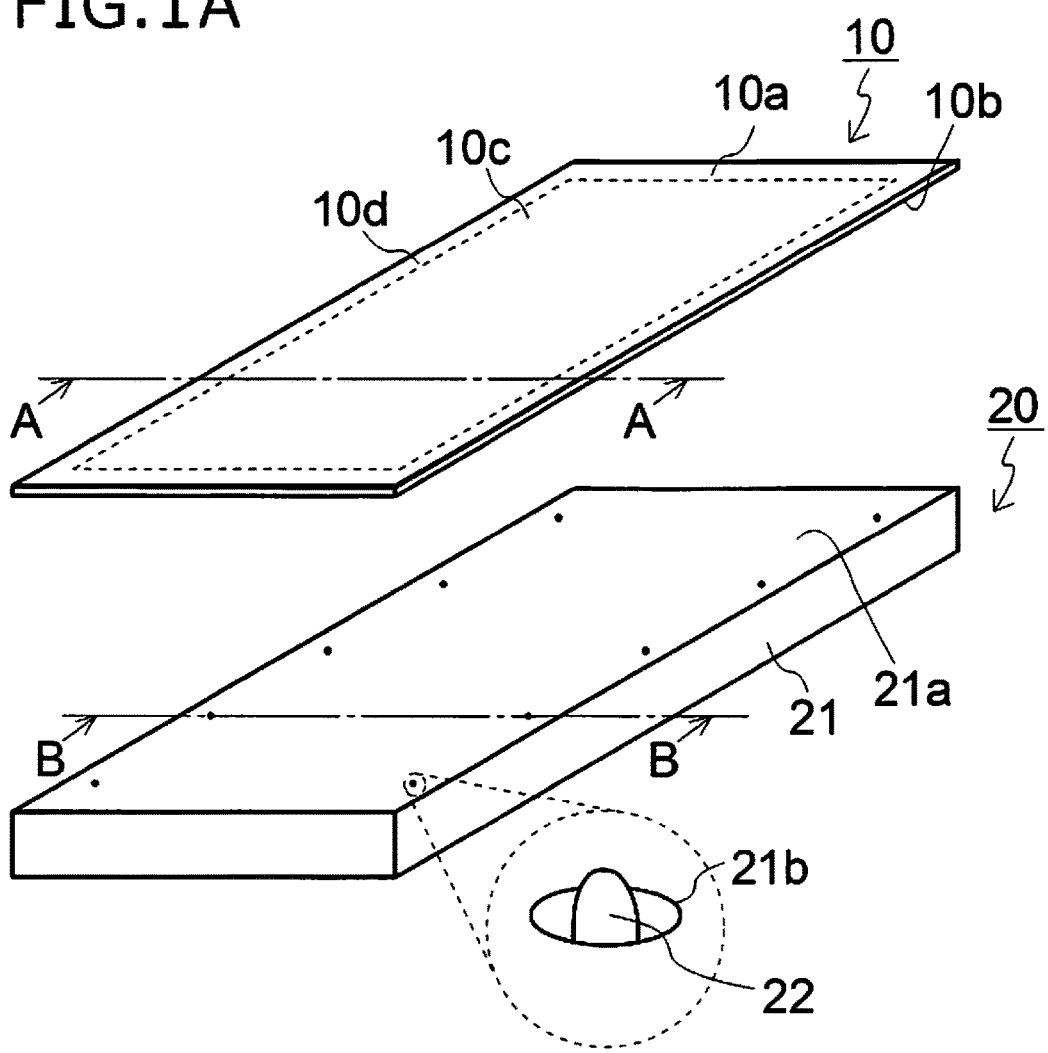
FIG. 1A is a schematic diagram illustrating a method of manufacturing a semiconductor device of one embodiment of the present invention.

Certain embodiments of the present invention will be described below with reference to the accompanying drawings. The embodiments shown below are intended as illustrative of a method of manufacturing a semiconductor device to give a concrete form to technical ideas of the present invention, and the scope of the invention is not limited to those described below.

Further, the members shown in claims attached hereto are not specifically limited to members in the embodiments. The sizes, materials, shapes and the relative configuration etc. of the members described in embodiments are given as an example and not as a limitation to the scope of the invention unless specifically described otherwise. Note that, the size, positional relationship and the like in the drawings may be exaggerated for the sake of clarity. In the description below, the same designations or the same reference numerals denote the same or like members and duplicative descriptions will be appropriately omitted.

A method of manufacturing at least one semiconductor device according to certain embodiments includes, providing a substrate having a flat lower surface, and an upper surface that allows mounting of at least one semiconductor element or an upper surface having at least one semiconductor mounted thereon; providing a work table having a support plate with a flat support surface for placing the substrate, and having a plurality of support pins arranged at a support surface side and configured to move along an up-and-down direction; abutting the lower surface of the substrate upon tip portions of the plurality of support pins to press down so that the lower surface of the substrate abuts upon the support surface of the support plate; and fixing the substrate on the support plate and performing one or more operations on the substrate.

In the specification, the term "flat" includes a surface having a fine roughness. For example, such a fine roughness may be about 50 μm or less. The fine roughness on the substrate may be formed by a plating provided on a part of a base body that is a component of the substrate, a fine roughness formed by roughening the surface, or by a flaw. The fine roughness on the support plate may be formed by roughening the support surface (i.e., an upper surface), may be a roughness due to a constituent material of the support plate, or may be formed by a flaw or chipping. That is, the term "flat" includes an unintentionally formed roughness as well as an intentionally formed roughness. The term "flat" also includes a roughness of 10 μm or greater that can be regarded as substantially flat, for example, a surface having one to several roughness shapes of very fine diameters.

The lower surface of the substrate or the upper surface of the support plate that has a plurality of roughness of 100 μm or greater can reduce occurrence of misalignment. The mechanism can be described as below. There is a moment when the substrate floats by air resistance immediately before the lower surface of the substrate comes in contact with the upper surface of the support plate. After the moment of float, the air between the lower surface of the substrate and the upper surface of the support plate is dispersed and moved in the roughness of the surface. That is, the moving direction of the air is dispersed, so that a force that allows the substrate shifting in a random lateral direction may not occur. The substrate falls while expelling the dispersed air in various directions. Accordingly, the substrate can be placed on the support plate without shifting. When the substrate or the support plate defines a through-hole, the air between the lower surface of the substrate and the upper surface of the support plate is expelled from the through-hole, so that the substrate does not easily float by the air resistance. Accordingly, at the time of placement of the substrate, the substrate is not easily shifted on the support plate.

When the lower surface of the substrate and the upper surface of the support plate are flat without having a roughness of 50 μm or greater, there is a moment when the substrate floats by air resistance immediately before the lower surface of the substrate comes in contact with the upper surface of the support plate, due to the air resistance. In this case, when the air is expelled to the outside, because the lower surface of the substrate and the upper surface of the support plate are flat, the air tends not to be dispersed and moves as a lump of air, while generating a stress. The substrate is subjected to the stress and pushed in a random direction. The air is then expelled from below the substrate, which is thought to result in placement of the substrate at a place other than at directly under the location where the substrate is released from the arm.

The direction and/or the distance of shifting of the substrate cannot be determined beforehand, because of a slight difference in timing of releasing from the arm, degree of warpage of the substrate, or the like. The support plate is provided with a positional adjustment mechanism, so that a shift of the substrate in its adjustable range will not result in a misalignment. However, when the shift of the substrate exceeds the adjustable range, resetting of the substrate is required, which requires to suspend associated devices In certain embodiments, the support plate to place the substrate is provided with support pins that are allowed to move in an up-down direction. The substrate released from the arm comes in contact with the tip portions of the support pins immediately before coming in contact with the upper surface of the support plate. The tip portions of the support pins are located higher than the upper surface of the support plate, so that the substrate is supported at multiple points by the tip portions of the support pins. The support pins are lowered by the weight of the substrate and the lower surface of the substrate and the upper surface of the support plate come in contact with each other. As described above, providing such a multi-point support immediately before two surfaces, i.e., the lower surface of the substrate and the upper surface of the support plate, are made in contact to each other, can sufficiently reduce shifting of the substrate that is caused by the pressure of the air between the two surfaces. Moreover, lowering the support pins while supporting the substrate by multiple-points by the support pins, the substrate can be placed without shifting.

Figure 1B:
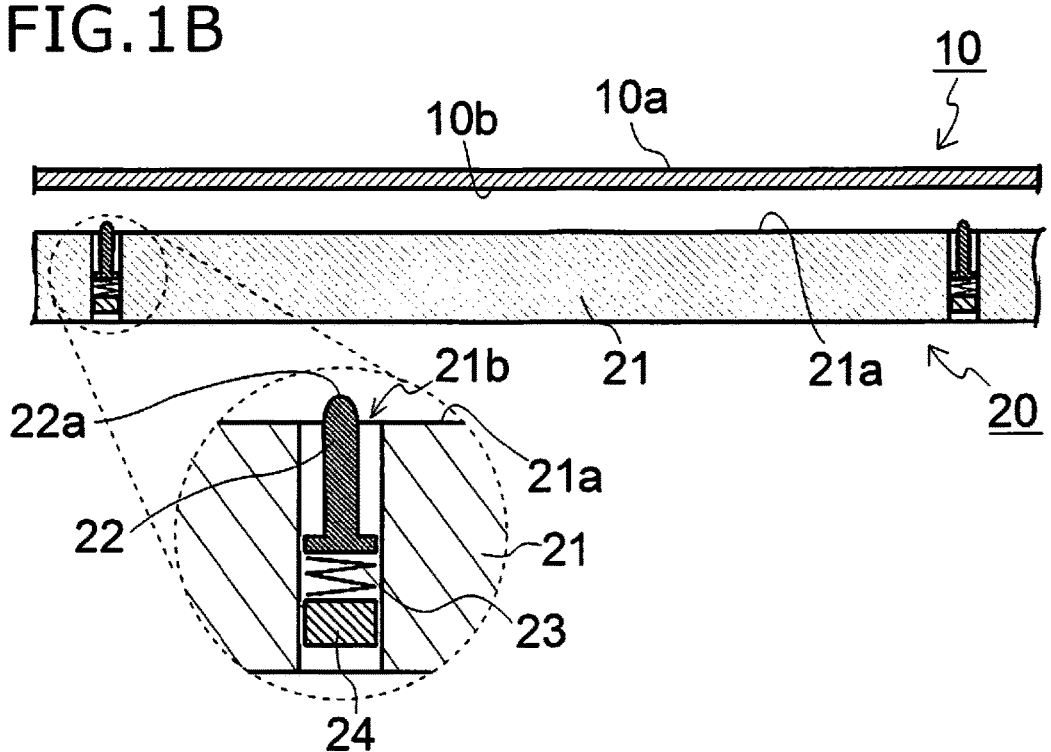
FIG. 1B is a schematic diagram showing a cross sections taken along line A-A and line B-B in FIG. 1A.

The respective steps will be described below.
Providing Substrate
FIG. 1A shows a state in which the substrate 10 and the support plate 21 to place the substrate 10 are provided, and FIG. 1B shows schematic cross-sections of the substrate 10 and the work table 20 respectively shown in FIG. 1A.

The substrate 10 provided has a plate-like shape that has the upper surface 10a and the lower surface 10b opposite to the upper surface 10a. The substrate 10 is used to obtain a plurality of semiconductor devices. The upper surface 10a of the substrate 10 is to mount electric components such as semiconductor elements and the lower surface 10b of the substrate 10 is to be arranged to face an upper surface of a secondary substrate. Further, the substrate 10 includes a predetermined product region 10c (shaded portion in FIG. 1A) that is to be divided to obtain individual semiconductor devices, and a predetermined margin to be removed 10d provided at periphery of the predetermined product region 10c.

As described above, the substrate is used to obtain a plurality of semiconductor devices, and can employ various configurations. That is, a substrate obtained through a certain step, a substrate having other electronic components through a successive manufacturing step, or the like, by adding various components or members while advancing the manufacturing. Examples of the substrate include substrates 10 mainly have different configurations in the predetermined product region 10c, and the substrates 10 further having different configurations in the predetermined product region 10c at the upper surface 10a side.

Among the substrates having different compositions, examples of the substrates employed to obtain light emitting devices having a light emitting element mounted on a ceramic substrate includes those shown below.

(1) a substrate formed of a ceramic material and a wiring,
(2) a substrate made of a ceramic substrate disposed with a die-bonding resin,
(3) a substrate made of a ceramic substrate mounted with a plurality of light emitting elements via a die-bonding resin, respectively,
(4) a substrate made of a ceramic substrate mounted with a plurality of light emitting elements via a die-bonding resin, respectively, and having wires electrically connected respectively to the plurality of light emitting elements, and
(5) a substrate made of a ceramic substrate mounted with a plurality of light emitting elements via a die-bonding resin, respectively, and having wires electrically connected respectively to the plurality of light emitting elements, and the plurality of light emitting elements and the wires are covered by a light-transmissive resin.

The examples shown above are a portion of the examples and other than such a ceramic, insulating member made of glass epoxy resin, thermosetting resin, thermoplastic resin, glass, or the like can also be used. In addition to the wiring, other electrically conductive members such as lead frame, metal foil, or the like, can also be included. In addition to the die-bonding resin, a bonding member such as solder, eutectic, metal paste, anisotropic electrically conductive member can also be included. In addition to the at least one light emitting element, at least one protective element or the like, can also be included. In addition to the wires, an electrically conductive member such as bump, a eutectic paste, a metal paste, or the like, can also be included. In addition to the light-transmissive resin, a light-transmissive member such as glass, or the like, can also be included.

Figure 4A:
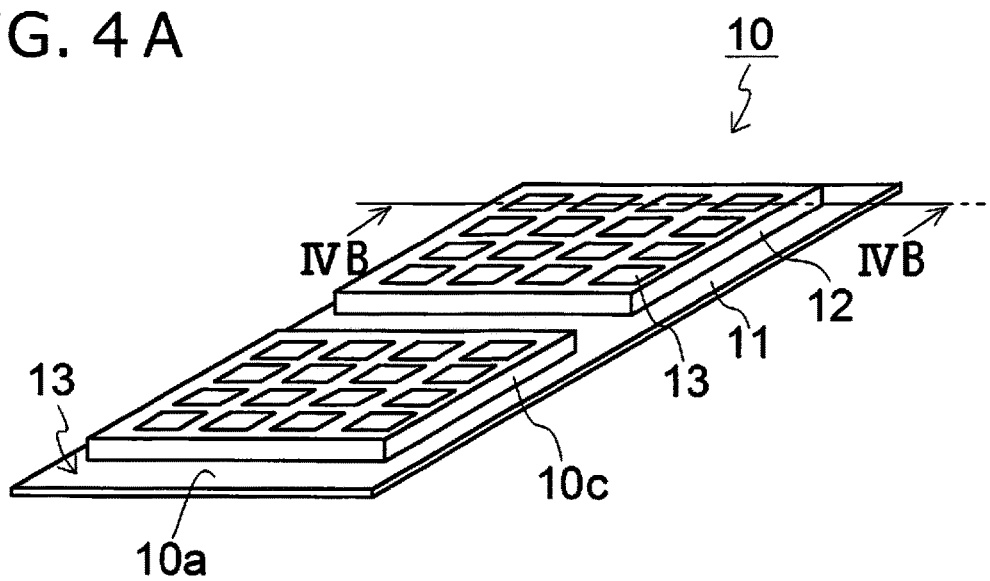
FIG. 4A is a schematic diagrams showing the substrate of one embodiment of the present invention.
Figure 4:
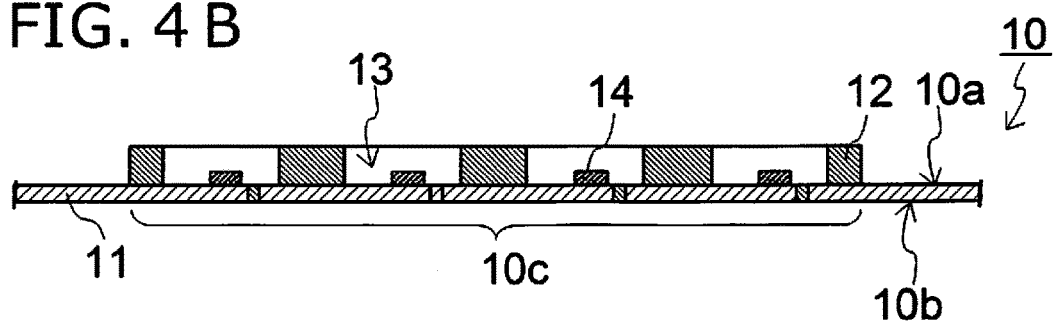
FIG. 4B is a schematic diagram showing a cross sections taken along line IVB-IVB in FIG. 4A.

The examples shown in FIGS. 4A and 4B are the substrate 10 having the lead frame 11 and the resin portion. The predetermined product region 10 c includes a plurality of recessed portions 13, and the semiconductor element 14 is placed in the recessed portion 13.

The substrate has a weight in a range of about 5 g to about 7 g. Also, the substrate has a planar area in a range of about 52 cm$^2$ to about 58 cm$^2$.

The predetermined region to be removed 10d of the substrate 10 is a portion that is held or pushed by jigs such as an arm, a screw, a spring, or the like at the time of moving or fixing, during manufacturing, and is a portion that will be separated from the predetermined product region 10c in a later step in the manufacturing. The predetermined region to be removed 10d is provided at the outer periphery of the substrate 10 with a width in a range of about several μm to about several mm corresponding to the size of the substrate 10 or the like. The planar area of the predetermined product region 10c is 60% or greater with respect to the planar area of the substrate 10. The predetermined region to be removed 10d is provided at the outer periphery of the substrate 10, to an entire outer periphery or to a part of the outer periphery. The support pins of the work table are preferably provided at locations that face the lower surface 10b side of the predetermined region to be removed 10d.

The substrate 10 may have an approximately rectangular shape in a top view. The substrate may also have an approximately square shape, polygonal shape, circular shape, oval shape, or a shape which is a combination of those. Also, as described later below, incomplete shapes of those shapes can also be employed as described below. The predetermined product region 10c can also have a shape such as, in a top view, an approximately square, rectangular, polygonal, circular, or elliptical shape, or a shape of a combination of those can be used.

The lower surface 10b of the substrate 10 is a flat surface. In more detail, the lower surface 10b of the substrate 10 is preferably flat in its most portions, but a particular region in the lower surface 10b may not necessarily be flat. The particular region is located near the outer periphery of the substrate 10, and examples thereof include the predetermined region to be removed 10d of the substrate 10. Such a particular region may be provided with an incomplete shape, a through-hole, or a recess, or the like, for the ease of positioning or for facilitating manufacturing steps. That is, the term a "substrate 10 having a flat lower surface" refers to a substrate 10 having a flat lower surface at a portion corresponding to the predetermined product region 10c.

Providing Work Table

A work table 20 includes a support plate 21 having a support surface 21a on which a substrate 10 will be placed, and support pins 22 arranged at the support surface 21a side. The support pins 22 are arranged in the openings 21b defined in the support surface 21a, respectively. Each of the support pins 22 is arranged on an elastic member 23 such as a spring, and the elastic member 23 is fixed to the support plate 21 or to a different member by a fixing member 24 such as a screw.

The support plate 21 is flat at the support surface (upper surface) 21a where the substrate 10 to be placed. In detail, the upper surface of the portion to place the predetermined product region 10c of the substrate 10 is flat. The portion to place the predetermined region to be removed 10d is provided with openings 21b. The number of the openings 21b is at least two, preferably three or more. The number of the openings 22b can be determined according to the size and the shape of the substrate 10. FIG. 1A shows an example where ten openings 21b are arranged with respect to a single substrate 10. The ten openings 21b are arranged five locations corresponding to the predetermined region to be removed 10d located at each of the two long sides of the approximately rectangular substrate 10. Further, the five openings 21b are arranged substantially symmetrical to the center line that passing through the centers of the short sides of the substrate 10. The five openings 21b arranged along a long-side are arranged at substantially equal intervals. As described above, arranging the openings 21b in good balance allows for sufficient reduction of occurrence of defects such as tilting of the substrate 10 when the support pins 22 support the substrate 10.

When the substrate 10 is not placed, the tip portions 22a of the support pins 22 are located higher than the support surface 21a. The tip portions 22a of the support pins 22 are preferably located in a plane at a height in a range of about 10 μm to about 30 μm higher than the support surface 21a.

The support pins 22 have an appropriate size corresponding to the weight of the substrate 10 or the like, that is to be supported by the support pins. The support pins 22 preferably have a maximum diameter in a range of about 1% to about 2% with respect to the opening diameter of the opening 21b defined in the support plate 21. For example, the maximum diameter of the support pins 22 can be in a range of about 0.4 mm to about 0.45 mm. The supporting pins 22 may also have a length in a range of about 3.25 mm to about 3.45 mm. Further, the supporting pins 22 may have a weight in a range of about 0.0135 g to about 0.0165 g.

The support pins 22 may have a shape such as a pillar shape or a cone shape, or a shape that is a combination of those, or further, a chamfered shape or a rounded shape. In the example shown in FIG. 1B, support pins 22 have a rounded tip portion 22a, a columnar middle portion having a smaller diameter, and a columnar base portion having a larger diameter.

For the elastic member 23, a coil spring, a plate spring, or the like, can be used. The elastic members 23 are configured to support the support pins 22, respectively, and needed to have a certain degree of elasticity so that the elastic members 23 are not compressed under the weight of the support pins 22 but are compressed when the substrate 10 is placed. Further, the elastic members 23 are required to hold the tip portions 22a of the support pins 22 at a predetermined height that is higher than the upper surface 21a of the support plate 21.

The elastic members 23 are required to have elasticity against the weight of the substrate 10 that allows lowering the support pins 22 when the substrate 10 is placed on the support pins 22. In other words, the elastic members 23 are needed to exert holding force so that stress is not applied to the substrate 10 from the support pins 22.

As described above, the elasticity of the elastic members 23 must be determined corresponding to the weight of the support pins 22 and the weight of the substrate 10. Further, stress applied on each of the support pins 22 differs according to the number of the support pins 22, so that the strength of the elastic members 23 also must be determined accordingly. Also, when an operation involving heating is performed after placing the substrate 10 on the support plate 21, the material of the elastic members 23 preferably has heat resistance against the operation temperature. For example, a material having about 200° C., of heat resistance is preferably employed. More specific examples thereof include stainless steel (SUS), aluminum, zirconia, cemented carbide, and of those, stainless steel is preferably employed.

The fixing members 24 are configured to fix the elastic members 23, and for example, screws, bolts, vises, or the like, may be used. The fixing members 24 are preferably removable so that the support pins 22 and the elastic members 23 can be replaced.

Placing Substrate on Work Table

Figure 2:
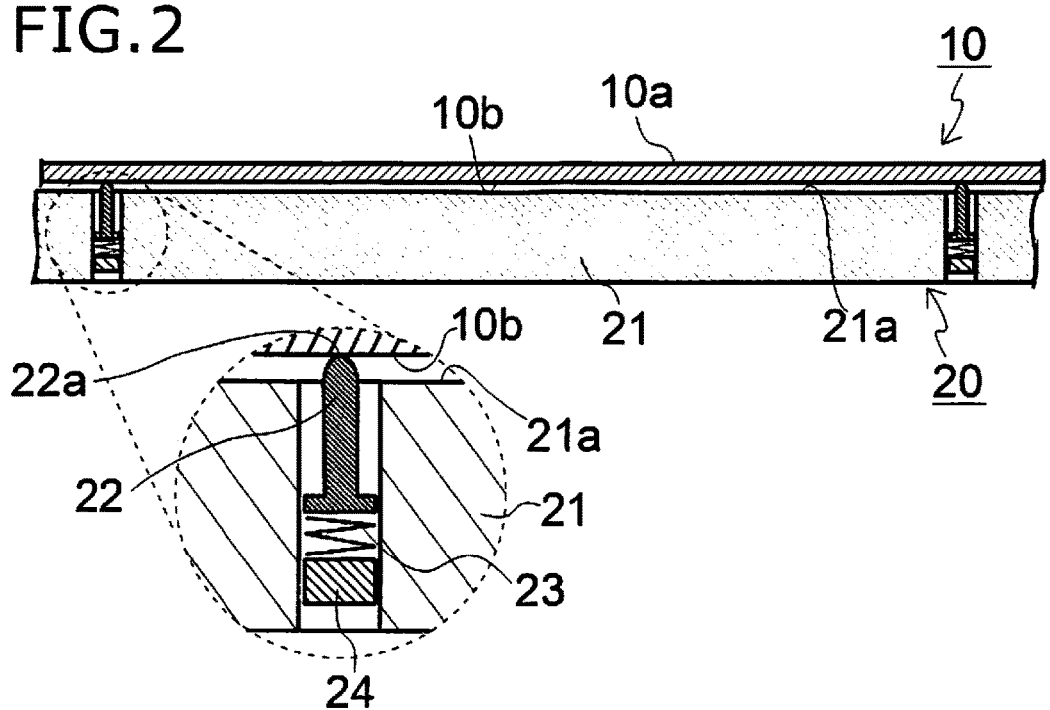
FIG. 2 is a schematic diagram illustrating a method of manufacturing a semiconductor device of one embodiment of the present invention.

In the placing the substrate 10 on the work table 20, first, as shown in FIG. 2, the lower surface 10b of the substrate 10 is made in contact with the tip portions 22a of the support pins 22. Accordingly, the substrate 10 is brought into a state supported only by the plurality of support pins 22. In this state, the lower surface 10b of the substrate 10 and the upper surface 21a of the support plate 21 are not in contact with each other and the air is present therebetween.

Figure 3:
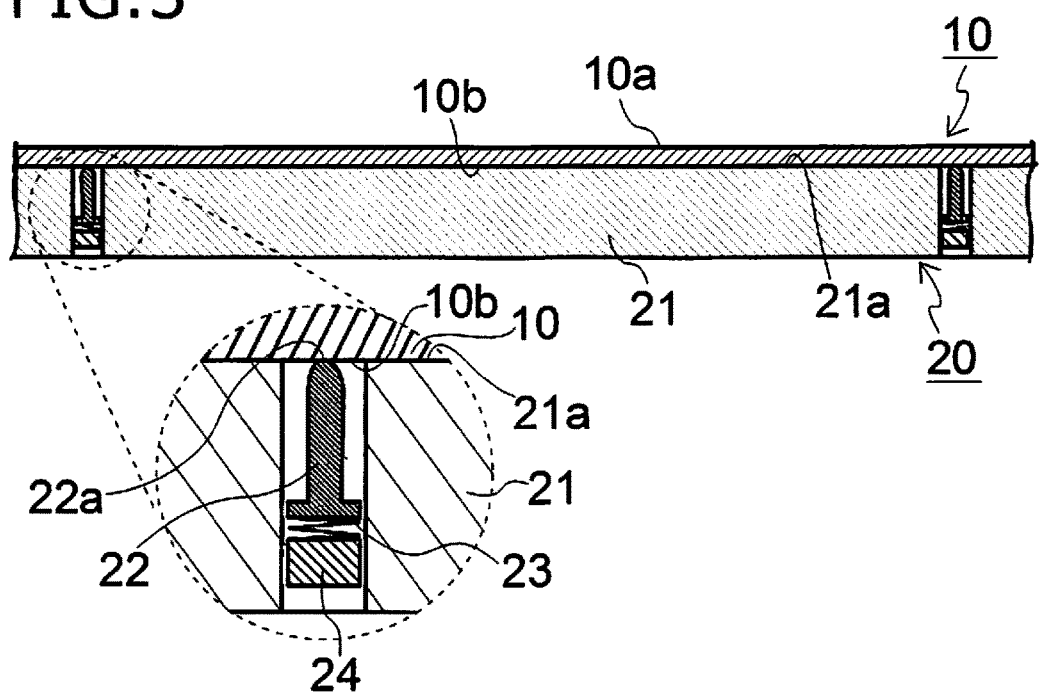
FIG. 3 is a schematic cross-sectional view illustrating a semiconductor device of one embodiment of the present invention.

Next, the support pins 22 are pressed down by the weight of the substrate 10, and as shown in FIG. 3, the lower surface 10b of the substrate 10 abuts upon the support surface (upper surface) 21a of the support plate 21. Accordingly, the substrate 10 can be placed on the work table 20.

The substrate 10 supported at plural points by the support pins 22 is not easily affected by the air resistance. Accordingly, the substrate 10 can be placed on the predetermined position of the support plate 21.

The lower surface 10b of the substrate 10 and the upper surface 21a of the support plate 21 are in contact with each other and the support pins 22 are also in contact with the lower surface 10b of the substrate 10. In this state, the support pins 22 are pressing the elastic members 23, and repulsive force that acts on the substrate 10 to float from the upper surface 21a of the support plate 21 is not generated. That is, until the substrate 10 is removed from the support plate 21, the elastic members 23 and the support pins 22 are prevented from moving in an up and down direction.

Performing Operation on Fixed Substrate

The substrate 10 placed on the work table 20 with good positioning accuracy as described above is fixed to the support plate 21 by using a fixing jig. Further, with the use of a camera, a sensor or the like, higher accuracy positioning is performed, and then operation of respective manufacturing steps is performed.

Examples of operations performed on the substrate that is fixed with good positioning accuracy will be shown below. In the examples shown below, operations included in the manufacturing steps to obtain a light emitting device having a plurality of light emitting elements mounted on a ceramic substrate will be illustrated.

(1) disposing die-bonding resin members on a substrate formed of a ceramic material and a wiring;

(2) mounting a plurality of light emitting elements via the die-bonding resin members, respectively, on a substrate made of a ceramic substrate disposed with die-bonding resin members;

(3) electrically connecting wires respectively to the plurality of light emitting elements that is mounted on a ceramic substrate via the die-bonding resin members respectively;

(4) disposing a light-transmissive resin member covering the plurality of light emitting elements and the wires, where the plurality of light emitting elements are mounted on the ceramic substrate via the die-bonding resin members respectively and the wires are electrically connected to the plurality of light emitting elements, respectively; and (5) disposing a thin film covering the light-transmissive resin member that covers the plurality of light emitting elements and the wires, where the light-transmissive resin is disposed to cover the plurality of light emitting elements mounted on the ceramic substrate via the die-bonding resin members respectively and the wires are electrically connected to the plurality of light emitting elements, respectively.

The examples shown above are a portion of the examples and other than such a ceramic, insulating member made of glass epoxy resin, thermosetting resin, thermoplastic resin, glass, or the like can also be used. In addition to the wiring, other electrically conductive members such as lead frame, metal foil, or the like, can also be included. In addition to the die-bonding resin, a bonding member such as solder, eutectic, metal paste, anisotropic electrically conductive member can also be included. In addition to the at least one light emitting element, at least one protective element or the like, can also be included. In addition to the wires, an electrically conductive member such as bump, a eutectic paste, a metal paste, or the like, can also be included. In addition to the light-transmissive resin, a light-transmissive member such as glass, or the like, can also be included.

In the manufacturing steps described above, when a processing involving heating is performed, the support plate 21 may be provided with a heating function, in which, the entire lower surface 10b (i.e., the entire predetermined product region) of the substrate 10 is preferably in contact with the support surface 21a. Because presence of unevenness in the surfaces creates portions that are in contact with each other as well as portions that are not in contact with each other, which creates difference in heat transmission, resulting in unevenness in heat transfer in the substrate 10, which in turn results in uneven processing. For this reason, providing unevenness in the lower surface 10b of the substrate 10 and/or in the support surface 21a in the aim of preventing the substrate 10 from shifting by the air resistance may not be preferable. However, according to certain embodiments, in such a step involving heating, shifting of the substrate 10 can be sufficiently reduced at the time of placing without providing an unevenness in the support surface 21a.

The method of manufacturing a semiconductor device according to the present disclosure can be used for a method of manufacturing a semiconductor light emitting device that uses a substrate.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing at least one semiconductor device, the method comprising:
    providing a substrate having a flat lower surface, and an upper surface that allows mounting of at least one semiconductor element or an upper surface having at least one semiconductor mounted thereon;
    providing a work table having a support plate with a flat support surface for placing the substrate, and having a plurality of support pins arranged at a support surface side and configured to move along an up-and-down direction, each of the support pins being arranged on an elastic member fixed to the support plate;
    abutting the lower surface of the substrate upon tip portions of the plurality of support pins to press down the plurality of support pins by weight of the substrate so that the lower surface of the substrate abuts upon the support surface of the support plate; and
    fixing the substrate on the support plate and performing one or more operations on the substrate.

2. The method of manufacturing a semiconductor device according to claim 1, wherein
    the tip portions of the plurality of support pins are arranged with a height in a range of 10 μm to 30 μm higher than the support surface when the plurality of support pins are not pressed down.

3. The method of manufacturing a semiconductor device according to claim 1, wherein
    the providing of the work table includes fixing the elastic member to the support plate by a fixing member.

4. The method of manufacturing a semiconductor device according to claim 1, wherein
the providing of the work table includes providing the plurality of elastic members with respect to the substrate so that, when the lower surface of the substrate abuts upon the support surface of the support plate, the plurality of support pins are respectively pressing the plurality of elastic members, and a repulsive force that acts on the substrate to float from the support surface of the support plate is not generated.

* * * * *